United States Patent [19]

Buckley

[11] Patent Number: 5,677,998
[45] Date of Patent: Oct. 14, 1997

[54] APPARATUS FOR PULSED ELECTRICAL CIRCUITRY

[75] Inventor: John Mark Buckley, South Wirral, United Kingdom

[73] Assignee: British Nuclear Fuels plc, Cheshire, United Kingdom

[21] Appl. No.: 211,935

[22] PCT Filed: Aug. 23, 1993

[86] PCT No.: PCT/GB93/01786

§ 371 Date: Jun. 8, 1994

§ 102(e) Date: Jun. 8, 1994

[87] PCT Pub. No.: WO94/04970

PCT Pub. Date: Mar. 3, 1994

[30] Foreign Application Priority Data

Aug. 21, 1992 [GB] United Kingdom ............. 9217890

[51] Int. Cl.⁶ .................. H02M 3/335; H04N 5/21; G06F 15/00
[52] U.S. Cl. .................. 395/22; 395/20; 395/21; 395/23
[58] Field of Search .................. 395/20, 21, 22, 395/23

[56] References Cited

U.S. PATENT DOCUMENTS

| | | | |
|---|---|---|---|
| 5,003,490 | 3/1991 | Castelaz et al. | 395/22 |
| 5,052,043 | 9/1991 | Gaborski | 395/22 |
| 5,092,343 | 3/1992 | Spitzer et al. | 395/22 |
| 5,146,602 | 9/1992 | Holler et al. | 395/23 |
| 5,251,626 | 10/1993 | Nickolls et al. | 607/14 |
| 5,258,903 | 11/1993 | Rodriquez-Cavazos | 395/902 |
| 5,283,418 | 2/1994 | Bellows et al. | 395/22 |
| 5,345,557 | 9/1994 | Wendt | 395/750 |
| 5,371,835 | 12/1994 | Akamatsu et al. | 395/24 |
| 5,440,566 | 8/1995 | Spence et al. | 364/550 |

FOREIGN PATENT DOCUMENTS

425309A2 5/1991 European Pat. Off. .
2296162 12/1990 Japan .

OTHER PUBLICATIONS

Ebron et al, "A Neural Network Approach to the Detection of Incipient Faults on Power Distribution Feeders", IEEE 1990.

Danials et al, "Power Quality Monitoring Using Neural Networks", IEEE Applications of Neural Networks to Power Systems, 1991.

Jayaraman et al, "Neural Net Based Correction of Power System Distortion Caused by Switching Power Supplies," IEEE Applications of Neural Networks to Power Systems, 1991.

*Primary Examiner*—George B. Davis
*Attorney, Agent, or Firm*—Nixon & Vanderhye P.C.

[57] ABSTRACT

Apparatus for pulsed electrical power circuitry includes a pulsed power supply circuit, monitor for monitoring a voltage or current characteristic within the supply circuit and an artificial neural network trained to identify whether the detected characteristic is acceptable or harmful and adapted to produce an output accordingly. The circuit may be arranged to deliver its output to a gas discharge load and the output of the trained network may be adapted to be fed to control a parameter in the circuit or in the load whereby a harmful condition in the circuit may be avoided.

13 Claims, 3 Drawing Sheets

APPARATUS FOR PULSED ELECTRICAL CIRCUITRY

BACKGROUND OF THE INVENTION

1. Field of the Invention

The present invention relates to apparatus for pulsed electrical power circuitry, including pulsed power supplies.

2. Discussion of Prior Art

Pulsed power supplies are employed to drive various high power loads such as lasers, especially gas discharge lasers such as copper vapour lasers (CVL).

The modulator switching element often employed in such a circuit is a thyratron. The load in the case of a gas discharge laser such as a CVL consists of a longitudinal discharge whose effective electrical impedance behaviour is highly non-linear, making impedance matching to the modulator impossible over a full operating cycle. The mismatch causes some of the energy incident at the load to be reflected back to the modulator where, in most cases, it causes the voltage across the thyratron (vak) to reverse polarity. Such reversals are usually accompanied by thyratron damage. A high proportion of CVL running costs are in thyratron replacements. Two factors which reduce the thyratron lifetime significantly are the inverse peak value and the reversal rate of vak. These in turn, depend upon discharge conditions.

Many methods which aim to identify the laser discharge conditions which severely stress the thyratron have been tried but have been found to be unsatisfactory in one form or another.

SUMMARY OF THE INVENTION

The purpose of the present invention is to monitor the current or voltage characteristic in a pulsed power circuit, so that conditions stressful to a component in the circuit, e.g. a thyratron, may be reliably detected to protect the component.

According to the present invention there is provided apparatus for pulsed electrical power circuitry including a pulsed power supply circuit, monitor means for monitoring a voltage or current characteristic within the supply circuit and an artificial neural network trained to identify whether the detected characteristic is acceptable or harmful and adapted to produce an output accordingly.

Voltage monitoring may be carried out using a known probe, which may, if required convert the monitored voltage into a signal proportional to the voltage but stepped down in magnitude.

Current monitoring may be carried out using a known device, e.g. a Rogowski coil (incorporating an integrator) or a resistor in series with the component being monitored, which produces an output proportional to the current.

The neural network approach used in this invention is not only able to identify stressful conditions quickly, but, if other stressful conditions develop, or a different type of load, e.g. a new laser head, is installed, the network can be retrained to identify the new undesirable conditions. In addition, a single neural network can be used to scan sequentially each of the loads, e.g. lasers, in an array.

The invention is simple enough to enable "user friendly" programs to be written to enable a person unskilled in computer systems (but experienced in the specific pulsed power circuit behaviour) to teach the neural network to give the appropriate output response to the applied waveform. These outputs can range from simply providing an alert e.g. by an audible sound or a visible indicator light, to automatically altering the power circuit conditions to reduce component stress. If a false alarm is generated or a new stressful condition identified, the operator can re-train the network. Although the invention is simple and inexpensive, it may facilitate automatic control of complex processes.

The apparatus according to the present invention may comprise a power supply for a high power laser, e.g. a gas discharge, e.g. metal vapour laser such as a copper vapour laser (CVL) or a plurality of such lasers. The characteristic monitored by the monitor means may be the voltage waveform across a thyratron or other switching element employed in the pulsed power circuit.

The neural network may be trained by storage of a set of signals representing a variety of monitored sample waveforms together with designations as to whether the sample waveforms are acceptable or unacceptable. The decisions as to whether the sample waveforms are acceptable or unacceptable may be made by a human operator who has observed a representation of the sample waveforms on a display, e.g. a digitising oscilloscope. The input to the trained neural network may also be obtained from such a display.

The apparatus according to the present invention may include a neural network which is adapted to receive inputs other than signals produced from current or voltage waveforms monitored in the pulsed power supply circuit. For example, in the case of a laser system, such inputs may include signals indicating one or more of power developed, gas pressured developed, valve switching slates, discharge frequency together with an indication as to whether each such input, which as appropriate may be either analogue or digital, is acceptable or not. Such a neural network may accept as a further input the output of the aforementioned neural network employed to assess whether the monitored voltage or current waveform is or is not acceptable. In other words, the apparatus according to the present invention may include a plurality of neural networks wherein the output of one neural network is employed as one of a plurality of inputs to another neural network. The latter neural network may be an overall system monitoring and control network and the neural network or networks providing inputs thereto may provide signals representing assessments relating to individual parameters relating to the system one of which relates to voltage or current waveform within the pulsed power circuitry.

GB 2123627 A describes the use of a microprocessor to analyse the current flowing through a control circuit including an interrupter. The system does not learn as the load conditions change nor is there any closed loop control to bring about minimisation of stress within components. The device simply isolates the circuit when it has detected pre-programmed waveforms. The device does not allow for steering the system to try and avoid having to carry out a complete isolation. Should the device fail to take the correct action, the fixed state programme used cannot be updated whilst continuing execution as in the present invention.

The following papers are prior art references describing the use of neural networks to monitor electrical systems.

Electrical Engineering in Japan, Vol. 112, No. 3, 1992, Y. Fukuyama, pages 80–88

IEEE Transactions on Power Systems, Vol. 7, No. 2, May 1992, N. Kandil, pages 812–819

IEEE Transactions on Power Delivery, Vol. 5, No. 2, April 1990, S. Ebron, pages 905–914

All of these papers described arrangement which simply monitor the waveforms in low frequency distribution systems. None is concerned with protecting a high power device or with taking corrective action without the need for "switch-off" when a harmful condition is detected in the circuit containing the high power device.

In the present invention the state of the output of the circuit being controlled, e.g. the state of discharge within a high power pulsed gas discharge laser is being monitored and the monitor signal can be employed to generate a suitable control signal.

In the case of the high power pulsed gas discharge laser the discharge produced large variations in impedance, which are very sensitive to impurities within the laser tube and the resulting gas discharge state. Impurity content within the discharge can bring about short time constant variations, some of which are potentially very stressful to the modulator switching components. In contrast, there are also variations with long time constants which indicate trends within the discharge state. Both short and long term variations can be detected by the apparatus according to the invention. In a preferred example of the present invention a Fourier transform of the sampled waveform in the time domain is produced in the frequency domain and by analysing various parts of the frequency spectrum great simplifications can be achieved in controlling a very complex situation. Prior to the invention, it was not obvious that in the case of a laser, there was any useful property to observe, fluctuations and drifts usually being regarded as wholly spurious.

BRIEF DESCRIPTION OF THE DRAWINGS

Embodiments of the present invention will now be described by way of example with reference to the accompanying drawings, in which.

DETAILED DISCUSSION OF PREFERRED EMBODIMENTS

Figure 1:
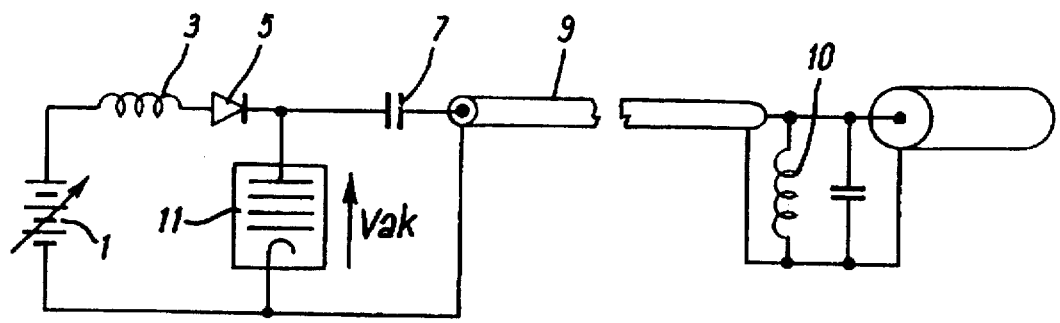
FIG. 1 is a circuit diagram of a known pulsed power supply circuit for a copper vapour laser.

In the diagram shown in FIG. 1 one terminal of a high voltage variable d.c. supply 1 is connected in series with a resonant charging supply consisting of an inductor 3, a diode 5, a capacitor 7, the inner conductor of a coaxial transmission line 9 and a peaking coil 10, to earth. The other terminal of the supply 1 is connected to the outer conductor of the transmission line 9. A thyratron 11 is connected between (at its one terminal) the junction between the diode 5 and capacitor 7 and (at its other terminal) the connection to the outer conductor of the transmission line 9. The voltage vak shown in FIG. 1 across the thyratron 11 is the parameter which is monitored in accordance with an embodiment of the present invention.

Figure 2:
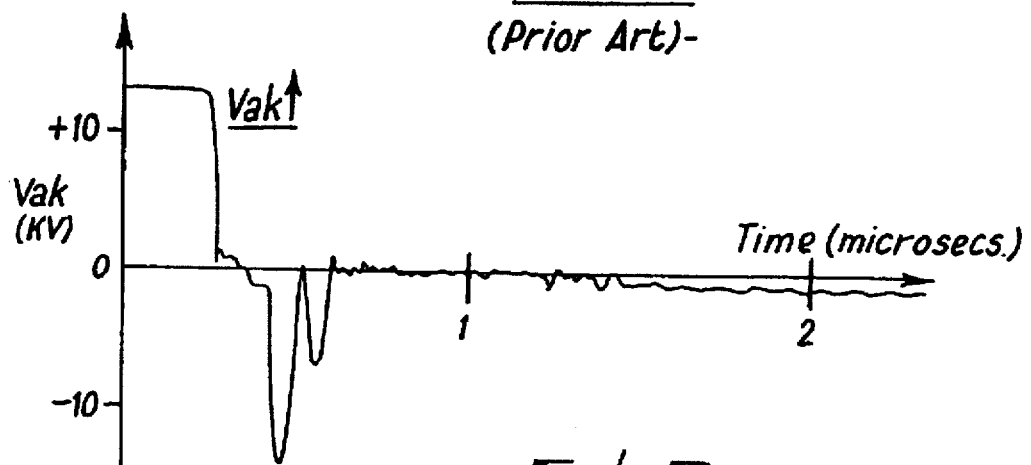
FIGS. 2 and 3 are graphs of voltage v time showing typical waveforms which are detrimental to the thyratron employed in the circuit shown in FIG. 1.
Figure 3:
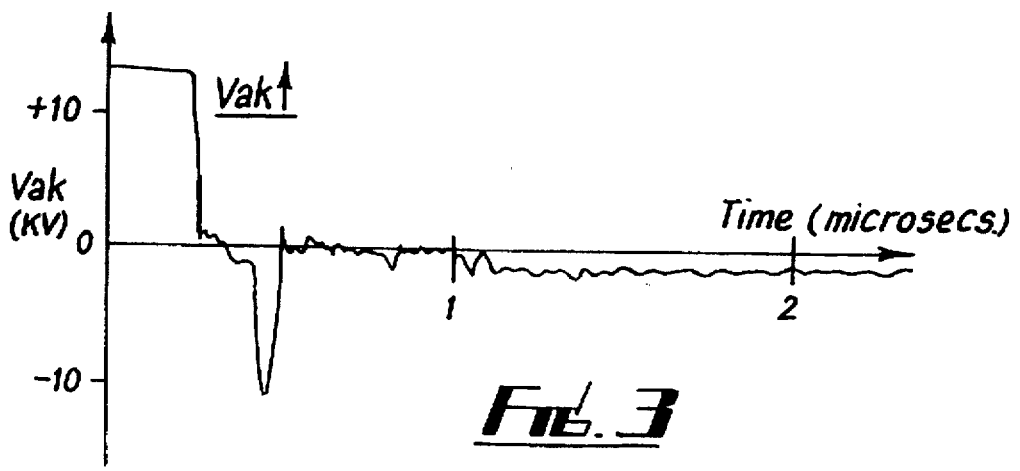

FIGS. 2 an 3 show examples of two actual waveforms measured for vak for a circuit as shown in FIG. 1. The time measured is that after firing of the thyratron 11. The illustrated waveforms both show a negative spike of 10 kV or greater which would be harmful to the thyratron 11 and an experienced operator would recognise this fact when observing displays of the waveforms of FIGS. 2 and 3.

Figure 4:
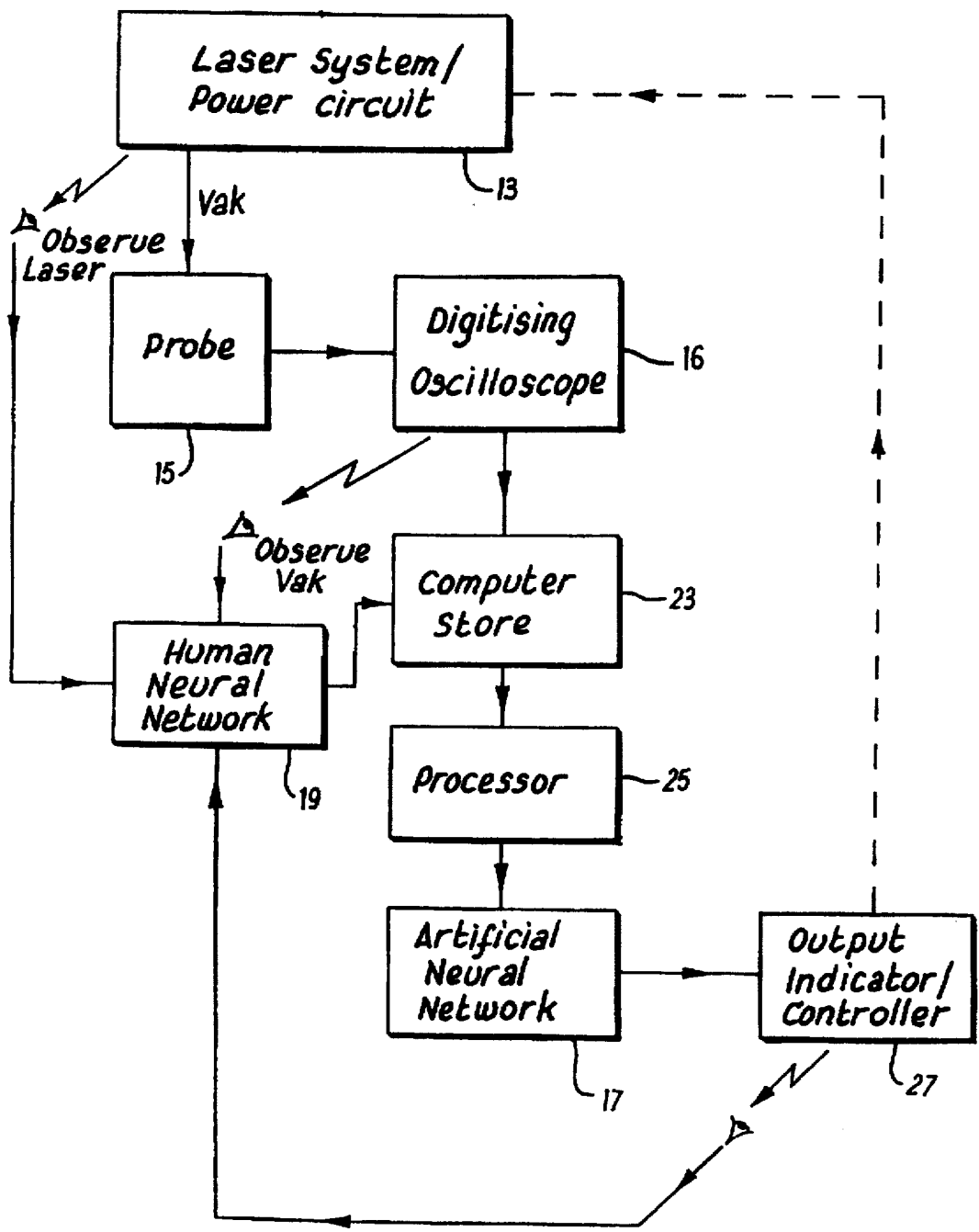
FIG. 4 is a schematic block circuit diagram showing the series of steps and hardware components employed in training and then using an artificial neural network to monitor the voltage characteristic across the thyratron in the circuit of FIG. 1.

FIG. 4 illustrates the system embodying the present invention. The circuit shown in FIG. 1 is indicated in FIG. 4 as item 13. The voltage vak is monitored by a probe 15 which produces as an output a signal which is a fraction of the monitored voltage and suitable for application to an oscilloscope apparatus. The output of the probe 15 is displayed on a digitising oscilloscope 16.

A skilled operator represented by a human neural network 19 is employed for training an artificial neural network 17. The operator monitors a series of different waveforms representing vak displayed in turn on the oscilloscope 16. For each waveform the operator observes the output of the laser, the assesses from previous experience whether the waveform displayed is acceptable or unacceptable.

Each waveform displayed on the digitising oscilloscope 16 is first compressed by a processor 25 in one of the ways described below and is then stored by a computer store 23 together with its assessment rating given by the operator. When the operator has decided that a good representation of all the acceptable and unacceptable waveforms likely to be experienced in practice have been recorded by the store 23 the information contained in the files of the store 23 is used to train the artificial neural network 17.

During monitoring of vak after training of the artificial neural network 17 the waveform representing vak is measured by the probe 15 and displayed on the oscilloscope 16. The signal displayed is transferred via the computer store 23 and processor 25 to the artificial neural network 17 which produces an output according to the training it has already received as to whether the monitored waveform is acceptable or unacceptable. The output is indicated on an output indicator/controller 27 and may be employed to adjust a parameter in the circuit 13.

It has been found that the majority of adverse thyratron vak conditions occur during the first 1 μs period after the thyratron has triggered. In an example of the above described embodiment of the invention, a digital oscilloscope (type Tektronix 11201) is arranged to sample the vak behaviour for around 1 μs after the thyratron has triggered. The waveform is then transferred via a parallel IEEE488 bus to a computer (IBM PC-XT) (computer store 23 and processor 25) for analysis.

"User friendly" programmes have been developed to enable a person unskilled in computer systems, but experienced in laser behaviour, to "teach" and then "test" the artificial neural network 17. During the "teaching/learning" phase, the operator is requested to set up the oscilloscope 16 to give a stable expanded image of the vak behaviour over the ~1 μs interval after the thyratron has triggered. At the start of a new session, the computer reads and stores the oscilloscope settings prior to displaying the first captured image. Of course the operator must not alter the oscilloscope settings again during the current "learning" phase. Next the operator requests an image to be captured. The captured image is displayed on the display of the computer terminal and the operator is requested to enter the output required. The outputs available can range from simply giving an alert, to actually altering the state of the laser head, in order to reduce (from the operator's experience) thyratron stress. Once the operator decides that a good representation of all the input waveforms likely to be experienced have been obtained, he requests the computer to combine all the learning files and put them into a suitable form for training the neural network 17.

The neural network 17 may be simulated by a serially executing computer, with the number of inputs kept to a minimum to minimise response time. The minimum number of samples per captured waveform which a typical digital oscilloscope can transfer is 512 (manufacturer's specification). However, for the variations in vak observed, it has been found unnecessary to use a neural network with 512 input nodes. In order to compress the input information, either of two known methods may be used. One option is to use simple time averaging. The other is to convert the time sampled waveform into the frequency domain using a Fast Fourier Transform (FFT) and discard negligible high order terms.

In the time averaging method, the 512 time samples from the oscilloscope are reduced to m samples by averaging groups of 512/m samples. These m samples form the inputs to a neural network with m input nodes.

In the FFT method, the time sampled vak waveforms are first windowed by multiplying the first and last 5% of the samples by a rising and falling sine curve, respectively. This ensures that the resultant waveform commences and ends at zero, thereby preventing errors in the frequency domain due to edge transients. An FFT is then executed on the resultant windowed sample. Examination of the spectrum produced by the FFT shows that most of the information concerning vak behaviour is contained in the first 32 harmonics. The magnitudes of these harmonics are used as the inputs to a neural network with 32 input nodes.

The neural network configuration of the network 17 used in an example of the embodiment shown in FIG. 4 consists of three layer with back propagation. The NeuralWare Inc. Professional II/Plus software package is used to implement the network. A network is classified as "trained" (according to the specification of the software supplier) when the RMS error graph (which gives an indication of the total error between the actual and desired outputs of the network), falls below 0.05 (ideal=0.0). Once "trained", the software package produces the source code of the "taught" network. The source code is then complied into a form in which it can be called by the system to calculate the network's output in response to a given set of inputs.

Both time averaging and frequency domain filtering (FFT) methods have been used successfully to train neural networks to alert an operator in the event of thyratron stress. In the former case a 64 input, 6 hidden and 1 output node network was used and in the latter a 32 input, 2 hidden and 1 output node network was used.

During use of the trained neural network to monitor vak of the thyratron, the oscilloscope 16 is firstly adjusted by the computer to have the same settings as those used during the learning phase. This ensures that any changes observed are not caused by changes in oscilloscope settings. Next, vak is read, put into the correct format and presented to the neural network 17 for judgment. The neural network 17 then either alerts the operator (prior to proceeding) or proceeds to read the next laser system. If the operator accepts the system's performance, the system can be left running, otherwise further training should be carried out.

In addition to monitoring of the parameter vak, the current in the thyratron circuit may also be monitored in one of the ways described above and the current characteristic could be employed in a similar way to that employed for the voltage characteristic to train, and then to use, an artificial neural network to monitor the characteristic to detect stressful conditions.

It should also be appreciated that the apparatus of the invention may be used for monitoring over long time periods in order to identify and reduce other component failures within the modulator switching elements of pulsed power circuits.

Figure 5:
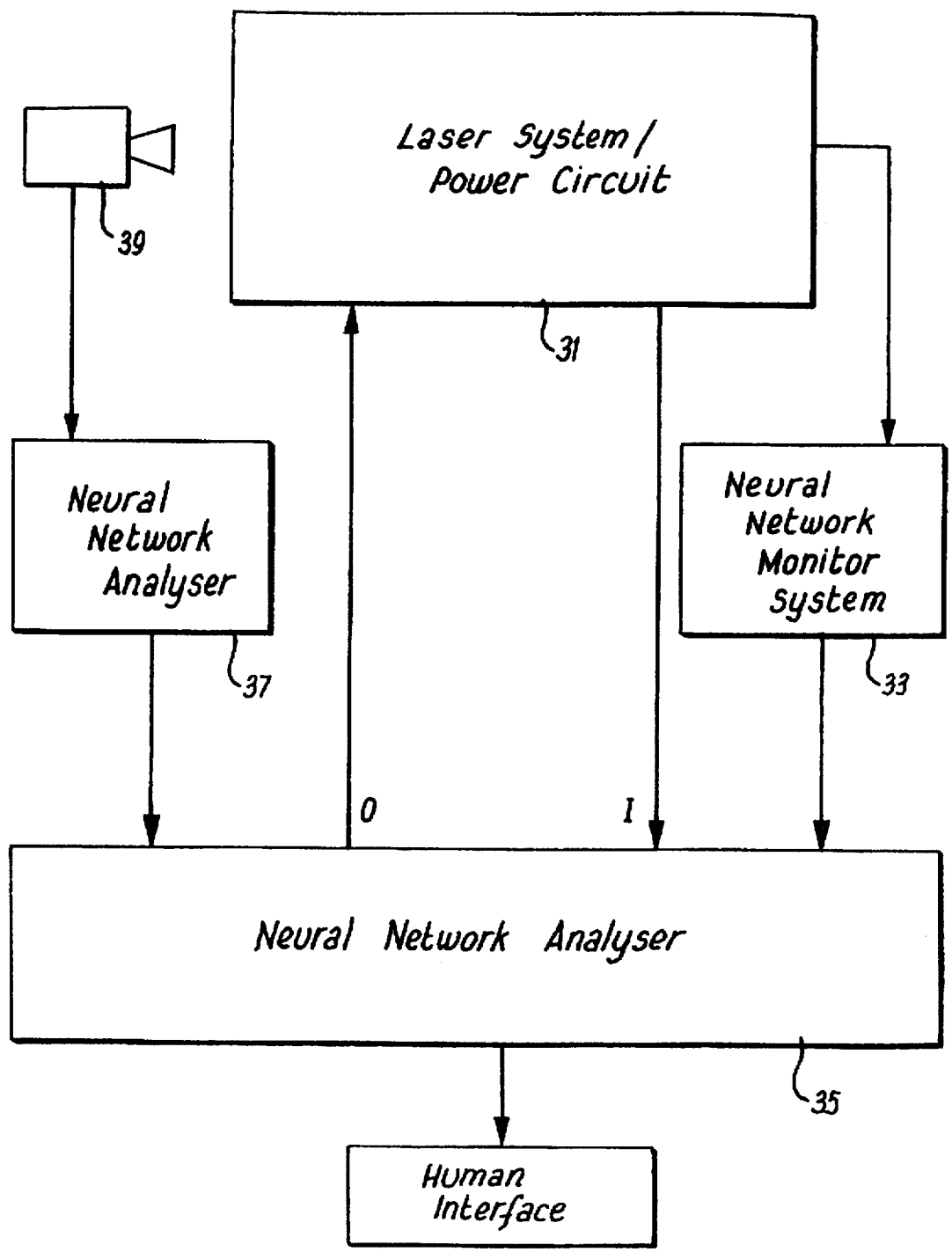
FIG. 5 is a schematic block circuit diagram of another embodiment of the present invention being a modified version of the embodiment shown in FIG. 4.

In the modified embodiment illustrated in FIG. 5 the laser system being monitored, e.g. as in FIG. 1, is indicated by reference numeral 31. The monitoring system comprising probe 15, oscilloscope 16, store 23, processor 25, artificial neural network 17 and output controller 27 (all as shown in FIG. 4) are shown collectively in the box indicated by reference numeral 33. The output of the neural network 17 may comprise a digital state or an analogue signal proportional to the probability of the monitored waveform being acceptable, and is fed to the output controller 27. In either case the output controller 27 of the system 33 provides an appropriate input to another neural network analyser 35 which is an overall state monitor for the laser system 31. The analyser 35 also accepts other inputs I indicating respectively laser discharge pressure (analogue), power (analogue) valve states (digital) and frequency (analogue). A further input to the analyser 37 which monitors via a CCD camera 39 the discharge straightness within the laser discharge of the system 31. The camera 39 is positioned to observe along the discharge tube at an oblique angle. The neural network of the analyser 35 is trained (in a manner similar to that used for the network 17) to observe when the discharge within the tube is beginning to twist and to provide an indicative output accordingly.

The neural network of the analyser 35 is trained in a manner similar to that used for the neural network 17 to recognise whether the various combinations of the signals it receives as inputs are acceptable or not. As in the circuit shown in FIG. 3 where the overall state of the system 31 is determined to be unacceptable an output O is provided to control one or more parameters, e.g. power, valve states or frequency in the system 31.

I claim:

1. Apparatus for monitoring pulsed electrical power circuitry for driving a high power laser, said apparatus including:

a pulsed high power laser power supply circuit, monitor means for monitoring a voltage or current characteristic within the pulsed high power laser power supply circuit, and an artificial neural network for identifying, based upon comparison with stored acceptable and harmful characteristics, whether the monitored characteristic is acceptable or harmful and for producing an output accordingly.

2. Apparatus as claimed in claim 1 and wherein the circuit is connected to deliver an output to a gas discharge load and the output of the artificial neural network is fed to control a parameter in the circuit or in the load whereby a harmful condition in the circuit may be avoided.

3. Apparatus as claimed in claim 2 wherein the output of the artificial neural network is connected to the load to adjust or control a parameter of the load.

4. Apparatus as claimed in claim 1 and wherein the laser is a copper vapour laser.

5. Apparatus as claimed in claim 1 and wherein the pulsed power circuit includes a thyratron and the characteristic to be monitored by the monitor means comprises a voltage waveform across the thyratron.

6. Apparatus as claimed in claim 5 and wherein the characteristic to be monitored by the monitor means comprises a voltage waveform during a first microsecond immediately after the thyratron has fired.

7. Apparatus as claimed in claim 5 and wherein the characteristic to be monitored by the monitor means comprises a voltage waveform during periods longer than a first microsecond immediately after the thyratron has fired.

8. Apparatus as claimed in claim 1 wherein the output of the artificial neural network produces a control signal which allows control of the circuit to avoid a situation harmful to the circuit.

9. Apparatus as claimed in claim 1 wherein the artificial neural network has been trained by storage of a set of signals representing a variety of monitored sample waveforms in the pulsed power supply circuit together with designations as to whether the sample waveforms are acceptable or unacceptable.

10. Apparatus as claimed in claim 9 wherein the artificial neural network has been trained by a process in which decisions as to whether the sample waveforms are acceptable or unacceptable has been made by a human operator who has observed the sample waveforms on a display.

11. Apparatus as claimed in claim 10 wherein an input to the trained artificial neural network is also obtained form the display.

12. Apparatus as claimed in claim 1 wherein the artificial neural network is adapted to provide an output to a further neural network which itself is adapted to receive inputs from other monitors arranged to monitor a state of various parameters of a system being monitored and controlled.

13. Apparatus as in claim 13 wherein a said further neural network is adapted to receive inputs from a plurality of neural networks each providing an output relating to an acceptability of a parameter of the system being monitored and controlled.

* * * * *